United States Patent
Li et al.

(10) Patent No.: US 10,354,696 B1
(45) Date of Patent: Jul. 16, 2019

(54) TOOL-LESS MOUNTING APPARATUS FOR HARD DISK DRIVE AND STORAGE DEVICE USING THE SAME

(71) Applicant: HONGFUJIN PRECISION ELECTRONICS (TIANJIN) CO., LTD., Tianjin (CN)

(72) Inventors: Cheng-He Li, Tianjin (CN); Gong-Wen Zhang, Tianjin (CN); Han-Yu Li, New Taipei (TW); Ya-Ni Zhang, Tianjin (CN); Wen-Hu Lu, Tianjin (CN)

(73) Assignee: HONGFUJIN PRECISION ELECTRONICS(TIANJIN)CO., LTD., Tianjin (CN)

( * ) Notice: Subject to any disclaimer, the term of this patent is extended or adjusted under 35 U.S.C. 154(b) by 0 days.

(21) Appl. No.: 15/960,655

(22) Filed: Apr. 24, 2018

(30) Foreign Application Priority Data

Mar. 8, 2018 (CN) .......................... 2018 1 0192793

(51) Int. Cl.
  *H05K 5/02* (2006.01)
  *G11B 33/02* (2006.01)
  *H05K 7/14* (2006.01)

(52) U.S. Cl.
  CPC .......... *G11B 33/022* (2013.01); *H05K 5/023* (2013.01); *H05K 7/1401* (2013.01)

(58) Field of Classification Search
  CPC .... G11B 33/022; G11B 33/124; H05K 5/023; H05K 7/1401; G06F 1/181; G06F 1/187
  USPC ............ 361/679.33, 679.37, 679.39, 679.34; 312/223.2; 248/274.1, 220.1
  See application file for complete search history.

(56) References Cited

U.S. PATENT DOCUMENTS

| | | | | |
|---|---|---|---|---|
| 8,749,966 | B1* | 6/2014 | Boudreau | G06F 1/187 361/679.33 |
| 2009/0059508 | A1* | 3/2009 | Peng | G06F 1/187 361/679.33 |
| 2011/0032665 | A1* | 2/2011 | Huang | G06F 1/187 361/679.01 |
| 2011/0085291 | A1* | 4/2011 | Lin | G06F 1/187 361/679.33 |
| 2013/0099640 | A1* | 4/2013 | Hu | G06F 1/187 312/223.2 |
| 2013/0127310 | A1* | 5/2013 | Yu | G06F 1/187 312/223.2 |
| 2015/0029656 | A1* | 1/2015 | Lu | G06F 1/187 361/679.39 |
| 2015/0077921 | A1* | 3/2015 | Tsai | G11B 33/124 361/679.33 |

(Continued)

*Primary Examiner* — Abhishek M Rathod
(74) *Attorney, Agent, or Firm* — ScienBiziP, P.C.

(57) ABSTRACT

An apparatus for mounting hard disk drive and storage device without the use of tools or fasteners includes a supporting base comprising opposite ends, elastic connecting members, and two side plates connected perpendicularly and respectively to opposite ends of the supporting base. Two elastic connecting members and an end plate connect between free ends of the pair of side plates through the elastic connecting members. Each side plate comprises one or more internal mounting pins and corresponding mounting holes are defined in sides of hard disk drive or storage device. A rotating plate is rotatable between closed and opened positions, the rotating plate can be closed to align the pins so as to clamp the device in place, or opened.

18 Claims, 4 Drawing Sheets

(56) References Cited

U.S. PATENT DOCUMENTS

2015/0313028 A1* 10/2015 Bell ................. F16F 3/12
　　　　　　　　　　　　　　　　　　　361/679.35

* cited by examiner

TOOL-LESS MOUNTING APPARATUS FOR HARD DISK DRIVE AND STORAGE DEVICE USING THE SAME

FIELD

The subject matter herein generally relates to mounting of hard disk drives and storage devices.

BACKGROUND

Demand for more storage capacity in servers means that more storage devices are needed to be placed in a limited space to achieve the purpose of expanding storage capacity. Modular maintenance and rapid replacement are becoming more and more important, thus the mounting of hard disk drives (HDDs) should be fast and easy.

BRIEF DESCRIPTION OF THE DRAWINGS

Implementations of the present disclosure will now be described, by way of example only, with reference to the attached figures.

DETAILED DESCRIPTION

Figure 1:
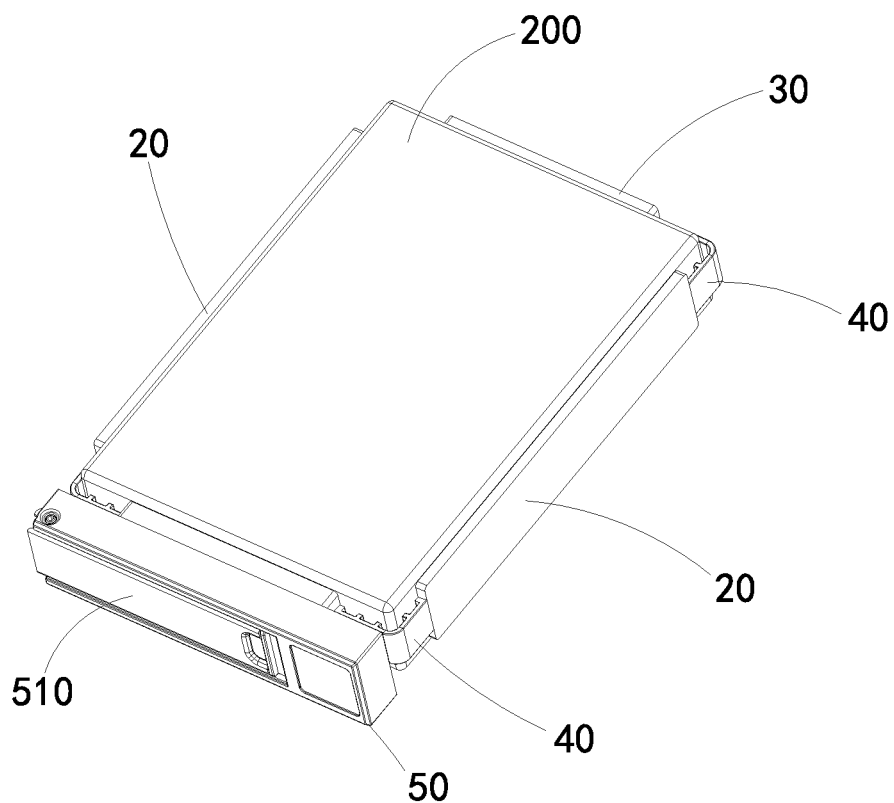
FIG. 1 illustrates an isometric view of an embodiment of a storage device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "comprising" means "including, but not necessarily limited to"; it specifically indicates open-ended inclusion or membership in a so-described combination, group, series, and the like.

Figure 3:
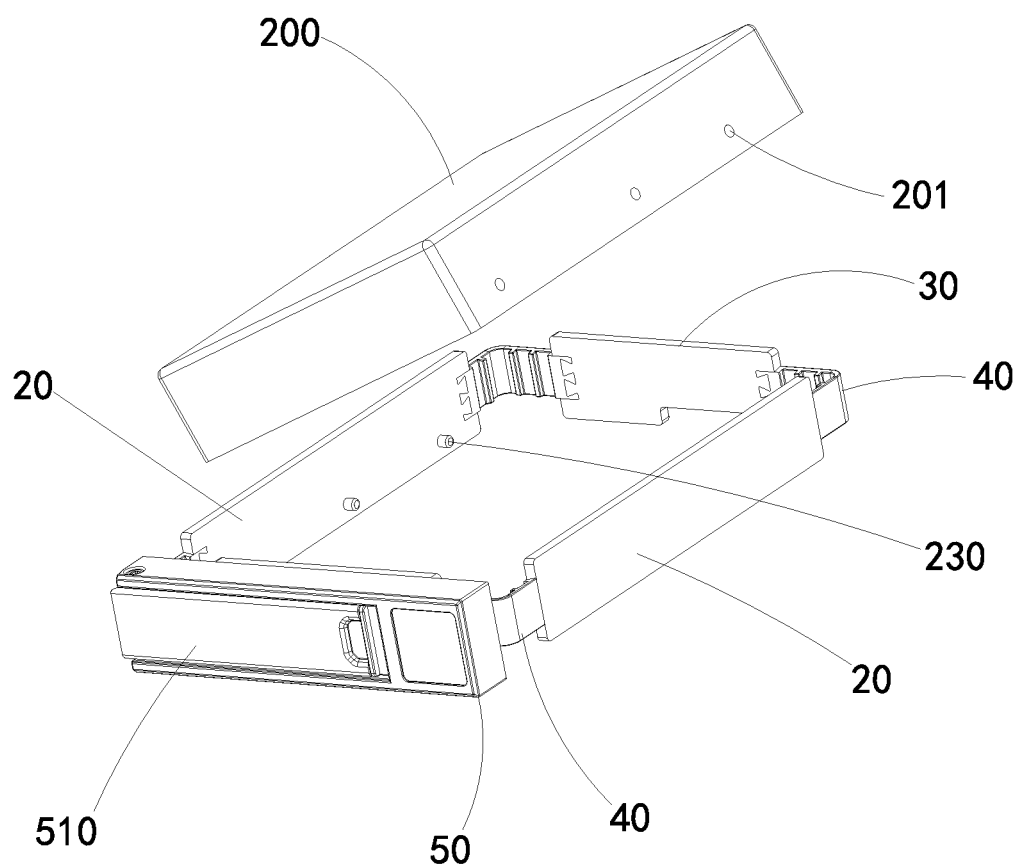
FIG. 3 illustrates another isometric view of the storage device of FIG. 1.

FIGS. 1 and 3 illustrate a storage device 500. The storage device 500 includes a hard disk drive 200 and a mounting apparatus 100 for mounting the hard disk drive 200.

Figure 2:
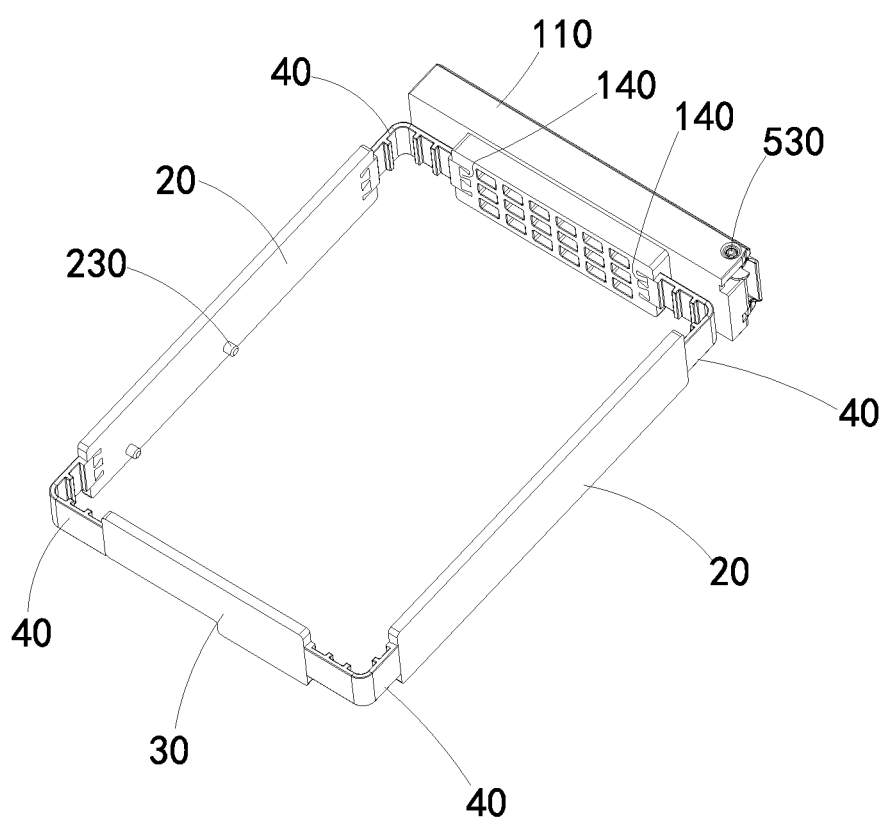
FIG. 2 illustrates an isometric view of the mounting apparatus of the storage device of FIG. 1, showing the mounting apparatus in a closed position.
Figure 4:
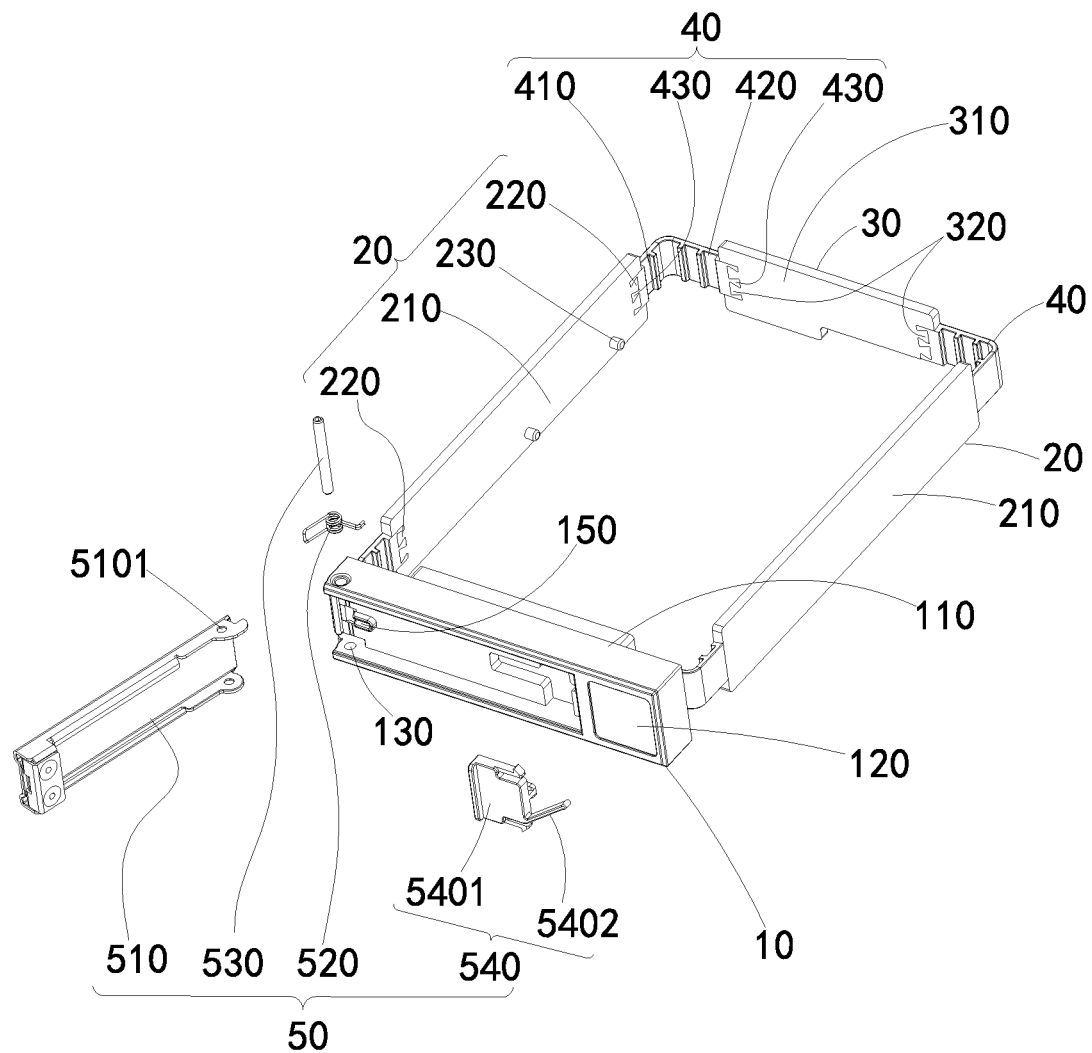
FIG. 4 illustrates an exploded view of the mounting apparatus of FIG. 2.

Referring to FIGS. 2 and 4, the mounting apparatus 100 includes a supporting base 10, two side plates 20, an end plate 30, and a plurality of elastic connecting members 40.

The supporting base 10 includes two opposite ends. Each of The two side plates 20 is perpendicularly and respectively connected to one of the two opposite ends of the supporting base 10 through the elastic connecting members 40.

The end plate 30 is connected between free ends of the two side plates 20 through the elastic connecting members 40.

Each of the two side plates 20 includes a mounting pin 230. The two side plates 20 can clamp the hard disk drive 200 in place, and at least one of the two side plates 20 is rotatable between a closed position and an opened position. When at least one of the two side plates 20 is rotated to the closed position, the two side plates 20 are substantially parallel with each other and the mounting pins 230 of the two side plates 20 are aligned with each other. When at least one of the two side plates 20 is rotated to the opened position, the mounting pins 230 of the two side plates 20 deviate from each other.

Two opposite side surfaces of the hard disk drive 200 define mounting holes 201 to correspond to the mounting pins 230.

When the rotating plate 220 rotates to the closed position, the mounting pins 230 of the two side plates 20 are aligned with each other, and each mounting pin 230 intrudes into a mounting hole 201 on opposite side surfaces of the hard disk drive 200. The hard disk drive 200 is clamped by the two side plates 20 and positioned by the mounting pins 230 and the mounting holes 201.

When at least one of the two side plates 20 is rotated to the opened position, the mounting pins 230 are not aligned with each other, and the hard disk drive 200 can be removed.

Each of the two side plates 20 can include a first connecting board 210 and two first clamping portions 220. The two first clamping portions 220 can be located at two opposite ends of the first connecting board 210.

The end plate 30 can include a second connecting board 310 and two second clamping portions 320 located at two opposite ends of the second connecting board 310.

An end of the supporting base 10 can include a third clamping portion 140.

Each of the plurality of elastic connecting members 40 can include two fourth clamping portions 430 located at opposite ends of each elastic connecting member 40. For example, each elastic connecting member 40 can include a first fastening plate 410 and a second fastening plate 420 perpendicularly connected to the first fastening plate 410. The first fastening plate 410 and the second fastening plate 420 are made of elastic materials, and the fourth clamping portions 430 are located at free ends of the first fastening plate 410 and the second fastening plate 420.

The first clamping portions 220, the second clamping portions 310, the third clamping portions 140, and the fourth clamping portions 430 can be hooks configured to hook onto one another.

Each of the mounting pins 230 is connected to an inner side of the first connecting board 210.

In at least one embodiment, the mounting apparatus 100 can further include an operating unit 50.

The operating unit 50 can include a handle 510 and a resilient clip 540 corresponding to the handle 510. The handle 510 is rotatably connected to the supporting base 10, and the resilient clip 540 is mounted to the supporting base 10.

The handle 510 is rotatable between an accommodating position (as shown in FIGS. 2-4) and a released position (as shown in FIG. 5). In the accommodating position, the handle 510 abuts the supporting base 10 and the resilient clip 540 is elastically deformed by resisting against a free end of the handle 510. In the released position, the resilient clip 540 releases the free end of the handle 510.

The supporting base 10 includes a chassis 110, and the chassis 110 defines an accommodating groove 120. The resilient clip 540 is slidably accommodated in the accommodating groove 120.

The resilient clip 540 can include a pushing block 5401 and a resisting arm 5402. An end of the resisting arm 5402 is fixed to the pushing block 5401.

When the handle 510 rotates to the accommodating position, the free end of the handle 510 resists against the pushing block 5401 and drives the pushing block 5401 to move. The resilient arm 5402 is elastically deformed, and the pushing block 5401 latches the handle 510 under restoring force of the resilient arm 5402.

The operating unit 50 can further include a pivot pin 530 and an elastic member 520 sandwiched between the handle 510 and the supporting base 10.

The supporting base 10 defines a pivot hole 130 corresponding to the pivot pin 530, and the handle 510 is rotatably connected to the supporting base 10 through the pivot pin 530 and the pivot hole 130.

When the handle 510 rotates to the accommodating position, the elastic member 520 is elastically deformed. When the resilient clip 540 is moved to release the free end of the handle 510, the handle 510 is driven to separate from the supporting base 10 under restoring force of the elastic member 520.

The elastic member 520 can be a torsion spring. The supporting base 10 can include a fixing end 150. The torsion spring is movably sleeved on the pivot pin 530, one end of the torsion spring is fixed to the fixing end 150, and the other end of the torsion spring resists against an inner surface of the handle 510.

The embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. A tool-less mounting apparatus for hard disk drive, comprising:
   a supporting base comprising two opposite ends;
   a plurality of elastic connecting members;
   two side plates perpendicularly and respectively connected to the two opposite ends of the supporting base through the elastic connecting members; and
   an end plate connected between free ends of the two side plates through the elastic connecting members;
   wherein each of the two side plates comprises a mounting pin; the two side plates define a clamping for mounting the hard disk drive, and at least one of the two side plates is rotatable between a closed position, where the two side plates are substantially parallel with each other and the mounting pins of the two side plates align with each other, and an open position, where the mounting pins of the two side plates are deviated from each other;
   wherein each of the two side plates comprises a first connecting board and two first clamping portions located at two opposite ends of the first connecting board;
   the end plate comprises a second connecting board and two second clamping portions located at two opposite ends of the second connecting board; the ends of the supporting base comprises a third clamping portion;
   each of the plurality of elastic connecting members comprises two fourth clamping portions located at two opposite ends of each of the plurality of elastic connecting members.

2. The mounting apparatus of claim 1, wherein each of the plurality of elastic connecting members comprises;
   a first fastening plate; and
   a second fastening plate perpendicularly connected to the first fastening plate; wherein the first fastening plate and the second fastening plate are made of elastic materials, and the fourth clamping portions are located at free ends of the first fastening plate and the second fastening plate.

3. The mounting apparatus of claim 1, wherein the first clamping portions, the second clamping portions, third clamping portion and the fourth clamping portions are hooks configured to hook with one another.

4. The mounting apparatus of claim 1, wherein each of the mounting pins is connected to an inner side of the first connecting board.

5. The mounting apparatus of claim 1, wherein the mounting apparatus further comprises an operating unit comprising:
   a handle rotatably connected to the supporting base; and
   a resilient clip corresponding to the handle and mounted to the supporting base; wherein the handle is rotatable between an accommodated position, where the handle abuts the supporting base and the resilient clip is elastically deformed by resisting against a free end of the handle, and a released position, where the resilient clip releases the free end of the handle.

6. The sliding apparatus of claim 5, wherein the supporting base comprises a chassis, and the chassis defines an accommodating groove; the resilient clip is slidably accommodated in the accommodating groove.

7. The sliding apparatus of claim 6, wherein the resilient clip comprises:
   a pushing block; and
   a resisting arm, wherein an end of the resisting arm is fixed to the pushing block; when the handle rotates to the accommodated position, the free end of the handle resists against the pushing block and drives the pushing block to move, and the resilient arm is elastically deformed; the pushing block latches the handle under restoring force of the resilient arm.

8. The mounting apparatus of claim 7, wherein the operating unit further comprises:
   a pivot pin; and
   an elastic member sandwiched between the handle and the supporting base;
   wherein the supporting base defines a pivot hole corresponding to the pivot pin, and the handle is rotatably connected to the supporting base through the pivot pin and the pivot hole;
   when the handle rotates to the accommodated position, elastic member is elastically deformed; and when the resilient clip is moved to release the free end of the handle, the handle is driven to separate from the supporting base under restoring force of the elastic member.

9. The mounting apparatus of claim 8, wherein the elastic member is a torsional spring; the supporting base comprises a fixing end; the torsional spring is movably sleeved on the pivot pin; an end of the torsional spring is fixed to the fixing end, and the other end of the torsional spring resists against an inner surface of the handle.

10. A storage device comprising:
a hard disk drive; and
a mounting apparatus for the hard disk drive, comprising:
a supporting base comprising two opposite ends;
a plurality of elastic connecting members;
two side plates perpendicularly and respectively connected to the two opposite ends of the supporting base through the elastic connecting members; and
an end plate connected between free ends of the two side plates through the elastic connecting members;
wherein each of the two side plates comprises a mounting pin; the two side plates define a clamping for mounting the hard disk drive, and at least one of the two side plates is rotatable between a closed position, where the two side plates are substantially parallel with each other and the mounting pins of the two side plates align with each other, and an open position, where the mounting pins of the two side plates are deviated from each other;
wherein each of the two side plates comprises a first connecting board and two first clamping portions located at two opposite ends of the first connecting board; the end plate comprises a second connecting board and two second clamping portions located at two opposite ends of the second connecting board; the ends of the supporting base comprises a third clamping portion;
each of the plurality of elastic connecting members comprises two fourth clamping portions located at two opposite ends of each of the plurality of elastic connecting members.

11. The storage device of claim 10, wherein each of the plurality of elastic connecting members comprises;
a first fastening plate; and
a second fastening plate perpendicularly connected to the first fastening plate; wherein the first fastening plate and the second fastening plate are made of elastic materials, and the fourth clamping portions are located at free ends of the first fastening plate and the second fastening plate.

12. The storage device of claim 10, wherein the first clamping portions, the second clamping portions, third clamping portion and the fourth clamping portions are hooks configured to hook with one another.

13. The storage device of claim 10, wherein each of the mounting pins is connected to an inner side of the first connecting board.

14. The storage device of claim 10, wherein the mounting apparatus further comprises an operating unit comprising:
a handle rotatably connected to the supporting base; and
a resilient clip corresponding to the handle and mounted to the supporting base;
wherein the handle is rotatable between an accommodated position, where the handle abuts the supporting base and the resilient clip is elastically deformed by resisting against a free end of the handle, and a released position, where the resilient clip releases the free end of the handle.

15. The sliding apparatus of claim 14, wherein the supporting base comprises a chassis, and the chassis defines an accommodating groove; the resilient clip is slidably accommodated in the accommodating groove.

16. The sliding apparatus of claim 15, wherein the resilient clip comprises:
a pushing block; and
a resisting arm, wherein an end of the resisting arm is fixed to the pushing block;
when the handle rotates to the accommodated position, the free end of the handle resists against the pushing block and drives the pushing block to move, and the resilient arm is elastically deformed; the pushing block latches the handle under restoring force of the resilient arm.

17. The storage device of claim 16, wherein the operating unit further comprises:
a pivot pin; and
an elastic member sandwiched between the handle and the supporting base;
wherein the supporting base defines a pivot hole corresponding to the pivot pin, and the handle is rotatably connected to the supporting base through the pivot pin and the pivot hole;
when the handle rotates to the accommodated position, elastic member is elastically deformed; and when the resilient clip is moved to release the free end of the handle, the handle is driven to separate from the supporting base under restoring force of the elastic member.

18. The storage device of claim 17, wherein the elastic member is a torsional spring; the supporting base comprises a fixing end; the torsional spring is movably sleeved on the pivot pin; an end of the torsional spring is fixed to the fixing end, and the other end of the torsional spring resists against an inner surface of the handle.

* * * * *